(12) United States Patent
Hattori et al.

(10) Patent No.: US 6,202,037 B1
(45) Date of Patent: Mar. 13, 2001

(54) QUALITY MANAGEMENT SYSTEM AND RECORDING MEDIUM

(75) Inventors: Nobuyoshi Hattori; Kaoru Yamana, both of Tokyo; Tomoki Tamada, Hyogo, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/123,457

(22) Filed: Jul. 28, 1998

(30) Foreign Application Priority Data

Feb. 26, 1998 (JP) .................................................. 10-045458

(51) Int. Cl.⁷ ..................................................... G06F 19/00
(52) U.S. Cl. .............................. 702/182; 702/35; 702/81; 702/82; 700/109; 700/721; 700/121
(58) Field of Search ................................ 702/182, 35, 81, 702/128, 83, 84, 82; 700/109, 110, 121; 714/724; 716/19.4; 356/237.1, 149, 241.1

(56) References Cited

U.S. PATENT DOCUMENTS

| 5,539,752 | * | 7/1996 | Berezin et al. | 716/4 |
| 5,561,596 | * | 10/1996 | Adams et al. | 371/58 |
| 5,598,341 | * | 1/1997 | Vo et al. | 700/110 |
| 5,649,169 | * | 7/1997 | Berezin | 703/23 |
| 5,712,701 | * | 1/1998 | Clementi | 356/237.2 |
| 5,801,965 | * | 9/1998 | Takagi | 702/35 |
| 5,801,985 | * | 9/1998 | Takagi | 382/149 |
| 5,896,294 | * | 4/1999 | Cho | 700/121 |
| 5,966,677 | * | 10/1999 | Fiekowsky | 702/95 |

FOREIGN PATENT DOCUMENTS

| 61-100941 | * | 5/1986 | (JP) . |
| 63-135848 | * | 6/1988 | (JP) . |
| 63-159737 | * | 7/1988 | (JP) . |
| 1-151243 | * | 6/1989 | (JP) . |
| 2-123748 | * | 5/1990 | (JP) . |
| 2-287241 | * | 11/1990 | (JP) . |
| 4-38457 | * | 2/1992 | (JP) . |
| 7-221156 | | 8/1995 | (JP) . |
| 8-195406 | * | 7/1996 | (JP) . |
| 8-274138 | * | 10/1996 | (JP) . |
| 9-199551 | * | 7/1997 | (JP) . |

* cited by examiner

*Primary Examiner*—Kamini Shah
(74) *Attorney, Agent, or Firm*—Oblon, Spivak, McClelland, Maier & Neustadt, P.C.

(57) ABSTRACT

A quality management system (S100) comprises a data processing unit (11), a processed-data judgment unit (12) receiving an output from the data processing unit (11), a sampling unit (13) receiving an output from the processed-data judgment unit (12), a file making unit (14) receiving an output from the sampling unit (13), a data processing unit (15) receiving an output from an observation unit (20) and a processed-data judgment unit (16) receiving an output from the data processing unit (15). The system (S100) having this constitution allows reduction in labor and time from finding of a defect to recognition of occurrence of abnormal condition and improvement in accuracy of fatality rate of the defect.

8 Claims, 8 Drawing Sheets

QUALITY MANAGEMENT SYSTEM AND RECORDING MEDIUM

BACKGROUND OF THE INVENTION

1. Field of the Invention

The present invention relates to a quality management system for a semiconductor device, and more particularly to a quality management system used in an in-line inspection.

2. Description of the Background Art

In order to increase and stabilize a yield of a semiconductor device, an inspection step is executed in a manufacturing line (in-line inspection) to observe the number of nonconformities (hereinafter referred to as "defects") between a semiconductor device under manufacture and that on design, and if the number of defects exceeds a specified upper limit, the defects are probed and what is the defect source is estimated, to get rid of the defect source.

Figure 7:
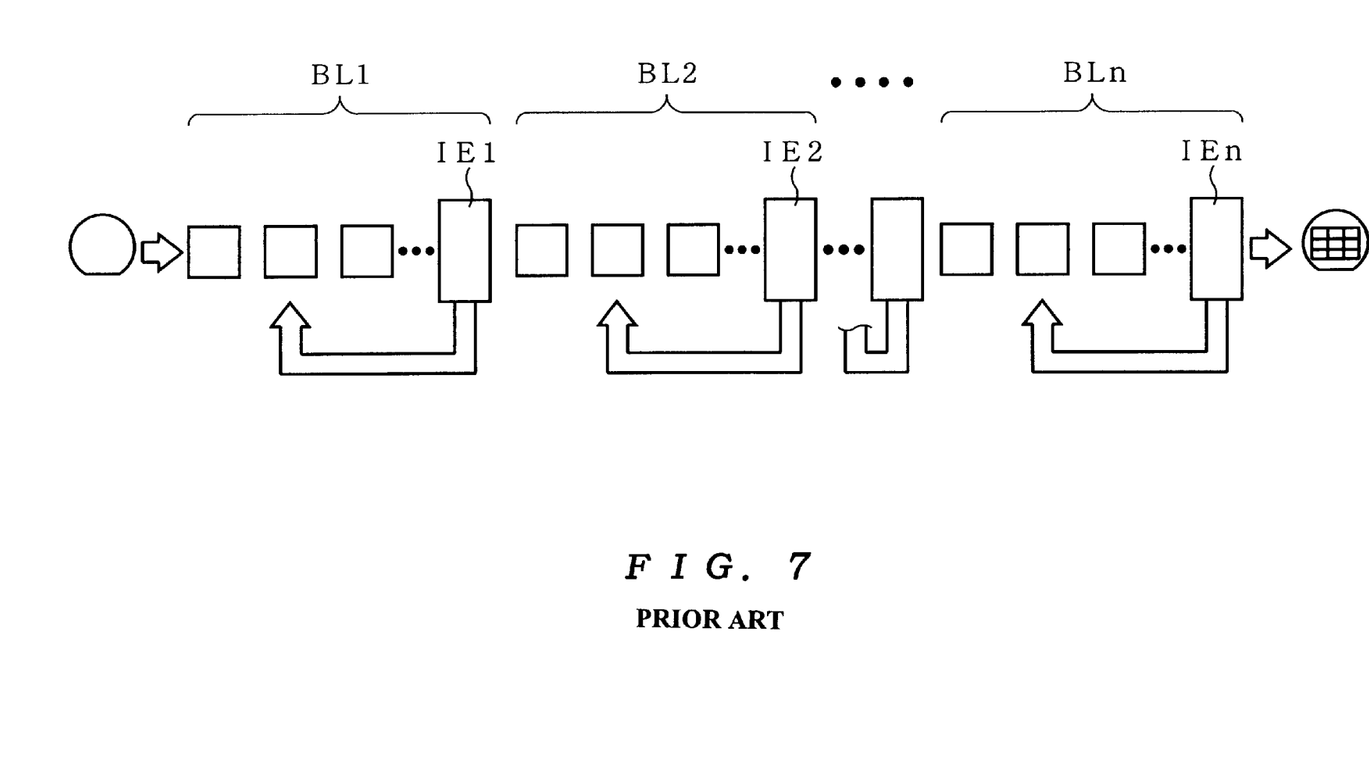
FIG. 7 is a conceptional diagram showing an in-line inspection.

FIG. 7 is a conceptional diagram showing a manufacturing line of a semiconductor device and an in-line inspection executed therein. A process for manufacturing a semiconductor device needs over two hundred steps only for dealing a wafer, and it sometimes takes two months or more from start to finish. In such a case, with an inspection (quality evaluation) after completion, all products through the process that is the defect source during the past two months, at the worst, may have defects found in the inspection, if any, resulting in a serious damage. In order to suppress the damage to the least, the manufacturing process is divided into blocks, each consisting of associated steps, and the inspection (quality evaluation) is made on a block-by-block basis as shown in FIG. 7 so that only two-or-three-days' damage is given if any defect is found. In FIG. 7, the manufacturing process is divided into blocks BLI to BLn and in-line inspection steps IE1 to IEn are provided at the respective last stages of the blocks.

Figure 8:
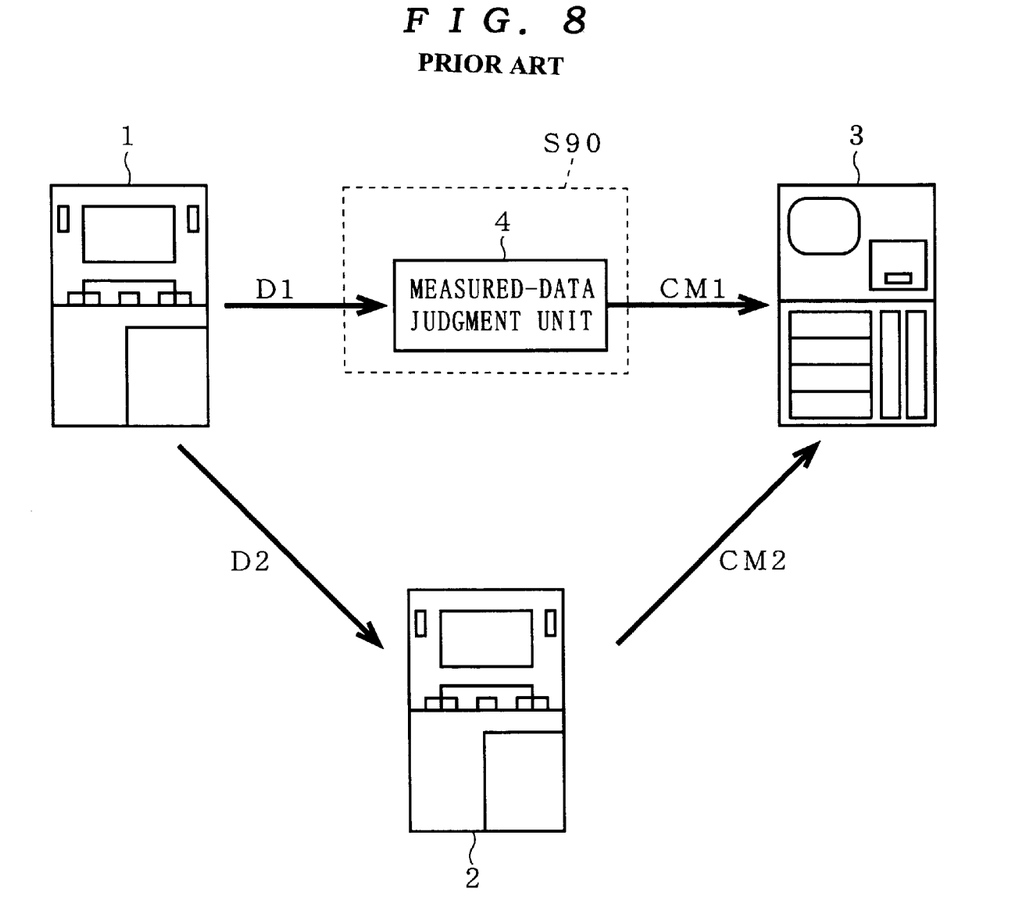
FIG. 8 is a block diagram showing a quality management system in the background art.

An outline of a prior-art in-line inspection will be discussed with reference to FIG. 8. First, some of wafers through the last step of a block are taken into an inspection device 1. As the inspection device 1 used may be an optical system utilizing intensity of scattered light for detection of defects, a mechanical system for mechanical detection of defects and the like. The inspection device of both types obtains measured data D1 such as positional coordinates and size of the defects to be given to a quality management system S90 for performing a quality management based thereon.

The quality management system S90 has a measured-data judgment unit 4 for comparing the number of defects and the number of chips having a defect with predetermined values (upper control limit values). If the measured-data judgement unit 4 makes a judgment that the number of defects or the number of chips having a defect exceeds the respective upper limits of the predetermined values, the unit 4 gives a warning or an operation instruction CM1 to associated apparatus 3 such as a semiconductor manufacturing apparatus.

As mentioned earlier, however, since the in-line inspection is made on a block-by-block basis for the semiconductor device through a plurality of (twenty to thirty) manufacturing steps, it is impossible to estimate what step causes the defect from only the data given by the inspection device 1. For this reason, the wafer to be inspected is set in an observation device 2 to analyze an image of the defect in detail. The observation device 2 comprises a magnifying device such as an optical microscope and an electron microscope and magnifies a defective portion with the aid of the positional information of the defect given by the inspection device 1, for observation.

The observation device 2 observes size and shape of the defect and condition of the defect and its periphery to thereby estimate what apparatus and process for manufacturing the semiconductor device may cause the defect (i.e., defect source) and give a warning or an operation instruction CM2 to the associated apparatus 3 such as a semiconductor manufacturing apparatus, if necessary.

Since the quality management system S90 as mentioned above is adopted in the prior-art in-line inspection, it is impossible to surely make a judgment of abnormal condition (deterioration in product yield) only because the number of defects or the number of chips having a defect exceeds the predetermined value.

Specifically, though an in-line inspection can detect a defect on a block-by-block basis and a probe can estimate the defect source, it is impossible to make a decision on what effect the defect has in all the steps, and in other words, whether the defect causes deterioration in product yield or not. Having a grasp of all the steps and knowing how an unsolved defect affects a final product makes it possible to make such a decision.

An human operator makes a judgment, from practical experience, on whether there is a defect that would cause deterioration in product yield, by observing defects one by one based on finding of defects on a block-by-block basis, and makes a decision on whether the manufacturing line should be stopped.

Therefore, it disadvantageously takes much time and labor from finding of defects to recognition of occurrence of abnormal condition in the conventional management system.

Further, the judgment from practical experience of a human operator on an influence degree (fatal or killer rate of the defect) has an accuracy problem as well as time and labor problems.

SUMMARY OF THE INVENTION

The present invention is directed to a quality management system for managing quality variance of a semiconductor device in a process of manufacturing the semiconductor device based on a design, by investigating defects of a semiconductor device under manufacture out of conformance with a design. According to a first aspect of the present invention, the quality management system comprises: first data processing means receiving first measured data on the defects outputted from a defect inspection device, for processing the first measured data to calculate first processed data including index values on the number and distribution of the defects; first processed-data judgment means receiving the first processed data, for making a judgment, based on a predetermined judgment condition, on whether a further investigation on the defects should be made or not; sampling means for sampling an object defect to be probed among the defects based on a predetermined sampling condition when it is judged that the further investigation should be made and outputting data on positional coordinates of the object defect to a defect analysis device; second data processing means receiving second measured data outputted from the defect analysis device as a result of analyzing the object defect based on the data on the positional coordinates, for processing the second measured data to calculate second processed data including index values at least on a shape of the object defect; and second processed-data judgment means receiving the second processed data, for automatically making an estimation, based on the second processed data, on what apparatus and process for manufacturing the semiconductor device may be a defect source.

According to a second aspect of the present invention, in the quality management system of the first aspect, the first measured data include at least one of the total number of defects in a unit of inspected area, area of each of the defects and area equivalent diameter, positional coordinates and indexes indicating size of each of the defects, the indexes indicating size being horizontal/vertical diameter, major axis and minor axis, the semiconductor device is one of a plurality of chips formed on a semiconductor wafer, the index values on the number and distribution of the defects include at least one of a first index value indicating the number of defects and the number of chips having the defects among the plurality of chips, a second index value indicating the number of defects within a predetermined size range and the number of chips having the defects among the plurality of chips within the predetermined size range, and a third index value indicating the number of defects in a predetermined cluster condition and the number of chips having the defects among the plurality of chips in the predetermined cluster condition, and the first processed-data judgment means further has a function of automatically making an estimation, based on the first processed data and at least one of the first to third index values, on what apparatus and process for manufacturing the semiconductor device may be the defect source.

According to a third aspect of the present invention, in the quality management system of the second aspect, the sampling condition includes at least one of a first condition defining that a specified number of the defects should be sampled in ascending or descending order of size, a second condition defining that some of the defects within the predetermined size range should be sampled, a third condition defining that some of the defects existing within a predetermined area or outside the predetermined area should be sampled, a fourth condition defining that the defects existing in the predetermined area should be sampled when the defects are in the predetermined cluster condition, and a fifth condition defining that the defects satisfying a combination of two or more out of the first to fourth conditions.

According to a fourth aspect of the present invention, in the quality management system of the first aspect, the defect analysis device is an observation device for observing the shape of the object defect, the second measured data are image data representing magnification of the object defect and its periphery, the index values on the shape of the object defect include at least one of indexes indicating two-dimensional shape of the object defect, namely, horizontal/vertical diameter, area equivalent diameter, surface area equivalent diameter, major axis, minor axis, area valance point, surface valance point and specific shape factor and indicating the three-dimensional shape of the object defect derived from the image data, namely, bulk factor, smooth factor, height, concavity/convexity and Fractal dimension, and the estimation on the defect source is made by checking the index values on the shape of the object defect with a database associating defective conditions of the apparatus and the process for manufacturing the semiconductor device with defects caused thereby.

According to a fifth aspect of the present invention, in the quality management system of the fourth aspect, the second data processing means further has a function of deriving at least one of index values on fatality of the defects, namely, the number of shorted wires, the number of disconnected wires and the number of defective cells, and the second processed-data judgment means further has a function of calculating a fatality rate of the defects to the semiconductor device based on the index values derived by the second data processing means.

According to a sixth aspect of the present invention, in the quality management system of the fifth aspect, the second processed-data judgment means judges whether there is any index value on the fatality of the defects, judges whether the object defect exists at a portion where any defect can be fatal to the semiconductor device when the index value is not zero, judges whether the portion is in an area which can be replaced by a redundant circuit in the semiconductor device or not when it is judged that the object defect exists at the portion where any defect can be fatal, and calculates the fatality rate from a possibility of replacing a circuit having any defect by the redundant circuit based on the index values on the positional coordinates, the size of the object defect and the fatality of the defects when it is judged that the portion is in the area which can be replaced by the redundant circuit.

According to a seventh aspect of the present invention, in the quality management system of the sixth aspect, the semiconductor device is one of a plurality of chips formed on a semiconductor wafer, and the second processed-data judgment means further has a function of totaling the fatality rates of the plurality of chips in the semiconductor wafer to judge quality of the plurality of chips and dividing the total number of failure chips in the semiconductor wafer by the total number of chips to obtain a failure rate.

The present invention is also directed to a recording medium for recording a program to perform a quality management of a semiconductor device with a computer by investigating defects of a semiconductor device under manufacture out of conformance with a design in a process of manufacturing the semiconductor device based on the design. According to an eighth aspect of the present invention, the program is used on the computer for performing: a first data processing function for receiving first measured data on the defects outputted from a defect inspection device and processing the first measured data to calculate first processed data including index values on the number and distribution of the defects; a first processed-data judgment function for receiving the first processed data and making a judgment, based on a predetermined judgment condition, on whether a further investigation on the defects should be made or not; a sampling function for sampling an object defect to be probed among the defects based on a predetermined sampling condition when it is judged that the further investigation should be made and outputting data on positional coordinates of the object defect to a defect analysis device; a second data processing function for receiving second measured data outputted from the defect analysis device as a result of anal zing the object defect based on the data on positional coordinates of the object defect and processing the second measured data to calculate second processed data including index values at least on shapes of the object defect; and a second processed-data judgment function for receiving the second processed data and automatically making an estimation, based on the second processed data, on what apparatus and process for manufacturing the semiconductor device may be a defect source.

The quality management system of the first aspect allows reduction in labor and time taken from finding of the defects in the in-line inspection to recognition of occurrence of abnormal condition since the system makes a decision, based on the first measured data given by the defect inspection device, on whether a further investigation should be made by the defect analysis device and makes an automatic estimation of the defect source based on the second measured data on the object defect to be probed which are given by the defect analysis device in the in-line inspection. Further, after the estimation of the defect source, the system gives the warning to the manufacturing apparatus and associated manufacturing process which are estimated to be the defect source to prevent a defective semiconductor device due to the defects from going through the manufacturing line, and therefore it is possible to avoid loss in expense for manufacturing the semiconductor device.

The quality management system of the second aspect can find the defect source in relatively early stage of the inspection in a case of relatively simple and general defect to reduce the time for the inspection since the first processed-data judgment means has the function of automatically estimating what apparatus and process for manufacturing a semiconductor device may be the defect source based on the first measured data and the first to third index values given by the defect inspection device.

The quality management system of the third aspect determines the sampling conditions suitable for the first measured data and the first to third index values, to ensure an appropriate sampling of the defects.

The quality management system of the fourth aspect determines the index value on the shape of the defect which is suitable for use of the image data from the observation device such as SEH (Scanning Electro microscope) and OM (Optical Microscope) which is a generally-used defect analysis device as the second measured data on the object defect and checks the index value with the database associating defective apparatus and processes for manufacturing a semiconductor device with defects caused thereby, to achieve a correct estimation of the defect source.

The quality management system of the fifth aspect determines the index values on the fatality of the defect to achieve an accurate calculation of the fatality rate of the defect.

The quality management system of the sixth aspect considers the possibility of replacement of the circuit having the defect by the redundancy circuit, to calculate the fatality rate of the defect by a simple and appropriate method.

The quality management system of the seventh aspect feeds the failure rate calculated by the second processed-data judgment means back to a production planning, for example, to prevent reduction in the volume of production due to failures.

When the computer having a function of performing the program written in the recording medium of the eighth aspect is electrically connected to the defect inspection device and the defect analysis device and performs the program, it is possible to reduce labor and time taken from finding of the defects in the in-line inspection to recognition of occurrence of abnormal condition since it is possible to make a decision, based on the first measured data given by the defect inspection device, on whether a further investigation should be made by the defect analysis device and make an automatic estimation of the defect source based on the second measured data on the object defect which are given by the defect analysis device in the in-line inspection. Further, after the estimation of the defect source, by giving the warning to the manufacturing apparatus and associated manufacturing process which are estimated to be the defect source, it is possible to prevent a defective semiconductor device from going through the manufacturing line and therefore avoid loss in expense for manufacturing the semiconductor device.

An object of the present invention is to provide a quality management system that allows reduction in time and labor from finding of defects in an in-line inspection to recognition of occurrence of abnormal condition and improvement in accuracy of fatality rate of the defects.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
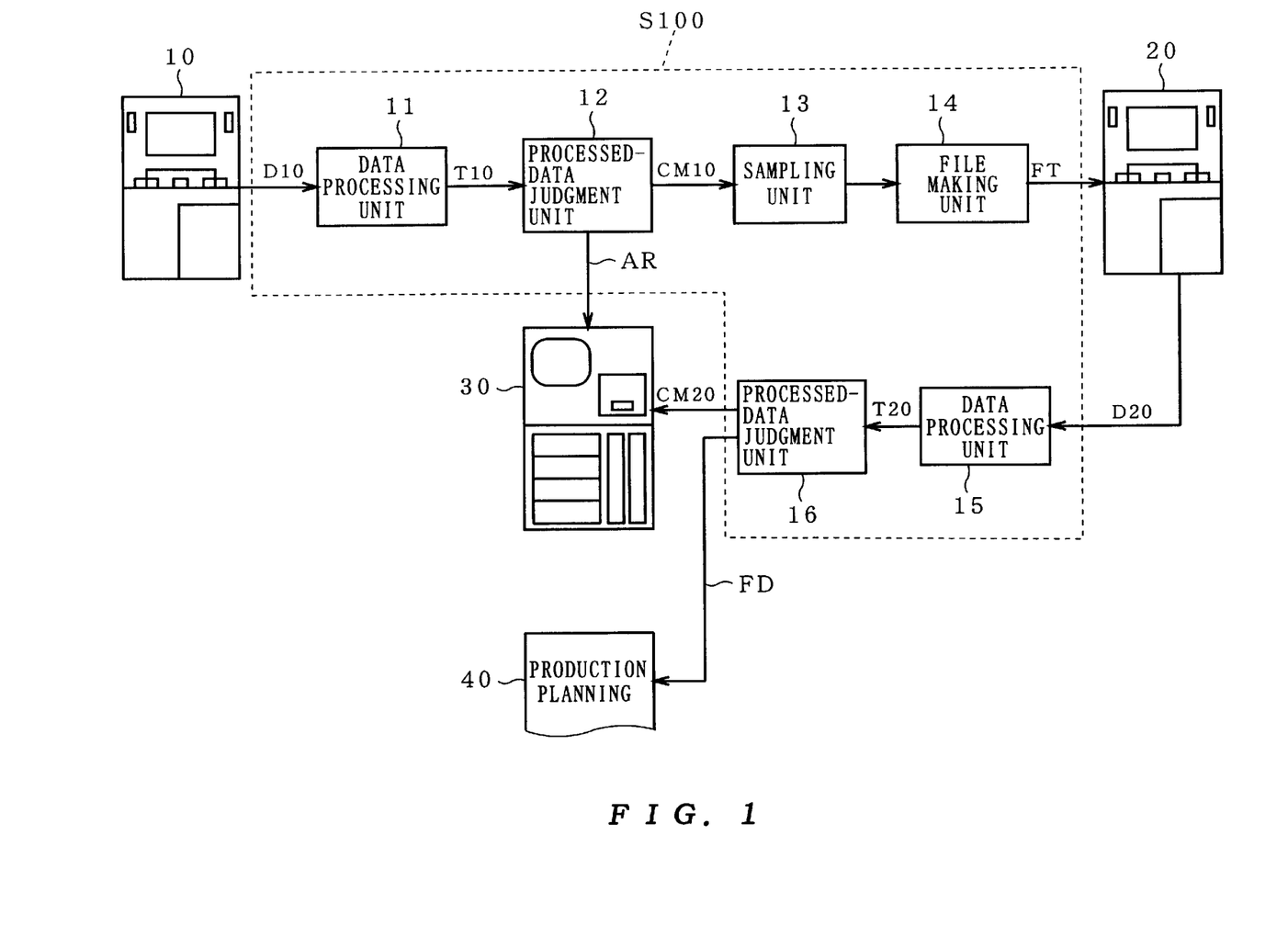
FIG. 1 is a block diagram showing a constitution of a quality management system in accordance with the present invention.

With reference to FIG. 1, a quality management system of the present invention will be discussed. The present invention is premised on an in-line inspection in which the whole manufacturing process is divided into blocks of associated steps and a wafer inspection (quality management) is made on a block-by-block basis.

A quality management system S100 of FIG. 1 has a data processing unit 11 (first data processing means), a processed-data judgment unit 12 (first processed-data judgment means), a sampling unit 13 (sampling means), a file making unit 14 (file making means), a data processing unit 15 (second data processing means) and a processed-data judgment unit 16 (second processed-data judgment means). The quality management system S100 will be discussed below in detail.

A. Inspection Device

An inspection device (defect inspection device) 10 of FIG. 1 locally irradiates a semiconductor device (chip) formed on a wafer with electrons or light (from ultraviolet light to visible light) and receives electrons or light reflected or scattered to reproduce brightness and chromaticity in accordance with intensity of the electrons or light. The device 10 performs this operation evenly over a predetermined range to obtain an actual image of the semiconductor device. Then, the device 10 compares the actual image with a prepared ideal image of the semiconductor device exactly according to a design, to specify nonconformities (hereinafter referred to as "defects") between the formed semiconductor device and the design.

The device 10 calculates measured data D10 (first measured data) such as the number of defects, an area of each defect and area equivalent diameter, horizontal/vertical (X or Y direction) diameter, major axis, minor axis and positional coordinates in a unit of inspected area (a predetermined area in a chip, a chip, a wafer or the like).

Figure 2:
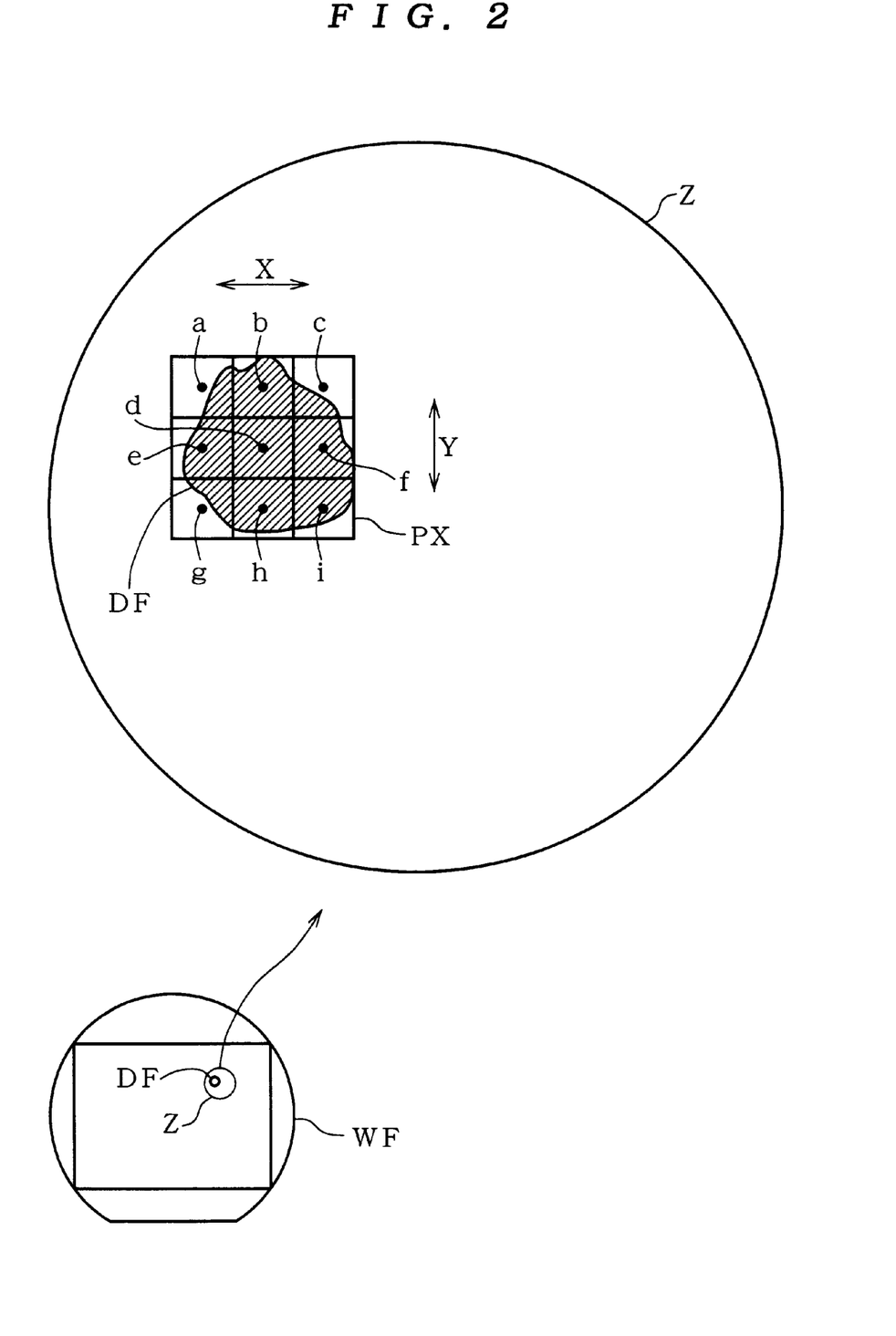
FIG. 2 is an illustration of a method for measuring a defect by an inspection device.

With reference to FIG. 2, calculation of the measured data D10 will be schematically discussed. FIG. 2 shows a defect DF existing in an area Z of a wafer WF, and also shows a magnification of the area Z.

As shown in FIG. 2, a plurality of pixels PX each of predetermined area (smaller than the defect DF) covers the defects DF to provide defect information such as coordinates of the center of constituent pixels (a to i), the number of pixels in X or Y direction and an area of the defect in each pixel. Multiplying the area of each pixel by the number of pixels each including a defect gives an area (approximate value) of the defect, obtaining the square root of the defect area gives the area equivalent diameter, the number of pixels in each direction gives the horizontal/vertical diameter, major axis and minor axis and the center coordinates of the constituent pixel gives the positional coordinates. The contents of the measured data D10 depend on kinds of inspection devices and makers and all the above-mentioned data items are not necessarily outputted, and therefore in some cases, the quality management system of the present invention makes calculation based on the defect information detected by the inspection device.

B. Basic Operation of Quality Management System

Figure 3:
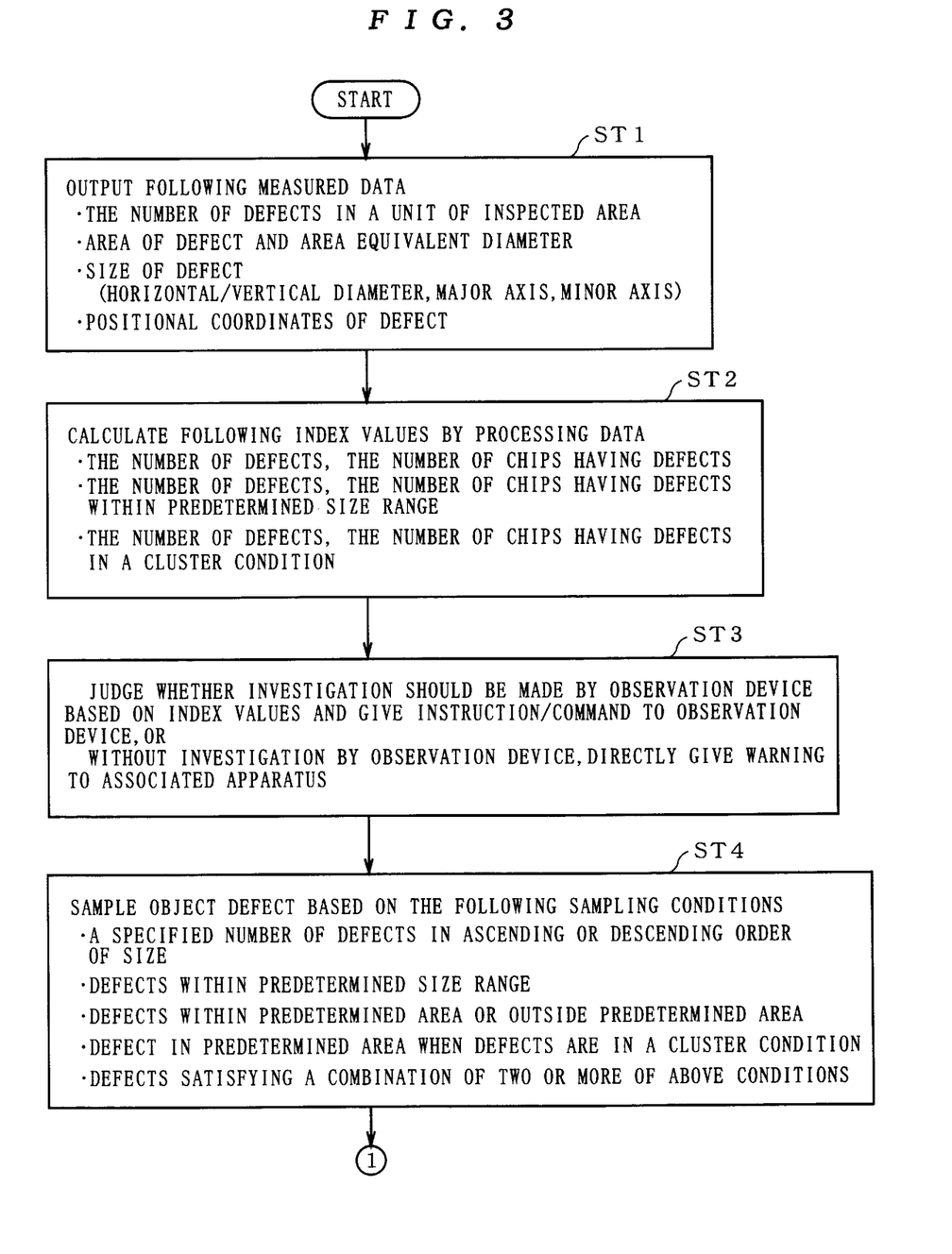
FIGS. 3 and 4 are flowcharts showing a basic operation of the quality management system in accordance with the present invention.

Using flowcharts of FIGS. 3 and 4, a basic operation of the quality management system will be discussed with reference to FIG. 1.

When the in-line inspection starts, first, the inspection device 10 calculates the above measured data D10 (Step ST1).

The data processing unit 11 processes the measured data 10 to calculate an index value ID1 indicating the number of defects and the number of chips having the defects, the index value ID2 indicating the number of defects and the number of chips having the defects within a predetermined size range and the index value ID3 indicating the number of defects and the number of chips having the defects in a cluster condition as processed data T10 (first processed data) (Step ST2). A simplest method of judging whether the defects are in a cluster condition or not is to check whether a distance between two defects is within a predetermined range, or if the third defect exists within the predetermined distance from the two defects, these defects are decided to be in a cluster condition. Thus, whether the defects are in a cluster condition or not is judged on a basis of the distance of the defects. As mentioned earlier, since the defects are given the positional coordinates, it is easy to know the distance of the defects.

Size refers herein to the horizontal/vertical diameter, the area equivalent diameter, the major axis and the minor axis. The horizontal/vertical diameter refers to a distance of two parallel lines that sandwich the defect image, and two kinds of diameters in X and Y directions which are orthogonal are generally used. The area equivalent diameter refers to a diameter of a circle that has the same area as the defect image.

The processed-data judgment unit 12 makes a judgment, with reference to the index values ID1 to ID3, on whether a further investigation (probe) should be made or not by an observation device (defect analysis device) 20, and if the probe should be made, the unit 12 gives an instruction/command CM10 to the observation device 20. If the defects exist in a relatively simple manner, e.g., in a limited area or at equal intervals, or the defects are of general kinds, the defect source can be estimated and the influence degree (fatality rate) of the defects to the product yield can be judged from the processed data T10 without investigation by the observation device 20, the unit 12 gives an warning AR to associated apparatus 30 such as a semiconductor manufacturing apparatus if necessary (Step ST3).

If the observation device 20 makes an investigation, the sampling, unit 13 samples a defect (object defect) to be observed based on a predetermined sampling condition (Step ST4). As the sampling condition adopted are a condition Q1 defining that a specified number of the defects should be sampled in ascending or descending order of size (horizontal/vertical diameter, area equivalent diameter, major axis or minor axis), a condition Q2 defining that the defects within a predetermined size range should be sampled, a condition Q3 defining that the defects existing within a predetermined area or outside the predetermined area should be sampled, a condition Q4 defining that the defects existing in the predetermined area should be sampled when the defects are in a cluster condition, a condition Q5 defining that the defects which meet a combination of two or more conditions out of the conditions Q1 to Q4 should be sampled, and the like.

Figure 4:
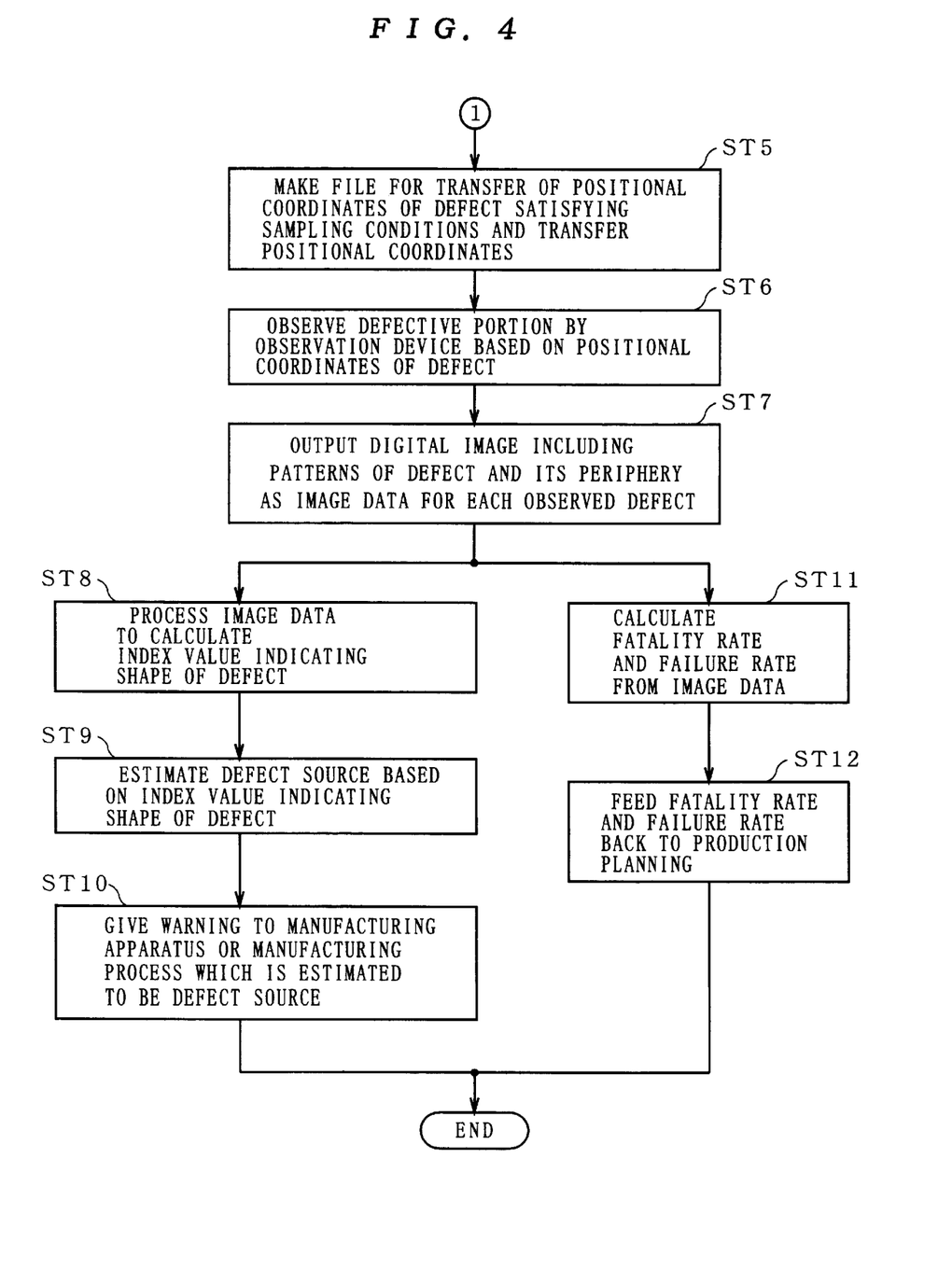

After sampling of the defect to be observed, as shown in Step ST5 of FIG. 4, the file making unit 14 makes a transfer file FT according to a predetermined protocol and transfers the file FT to the observation device 20 in order to give the positional-coordinate information of the defect thereto. Concurrently, the inspection device 10 transfers a wafer to be inspected to the observation device 20.

The observation device 20 makes an observation of the defect based on the positional-coordinate information in the transfer file FT (Step ST6). The device 20 comprising a magnifying device such as an optical microscope and an electron microscope receives the positional-coordinate information of the defect and magnifies the defect and its periphery to output image data D20 (second measured data) including an image of the defect and its periphery (Step ST7).

The image data D20 obtained as above are used for two purposes, i.e., estimation of the defect source and estimation of a fatality rate and a failure rate of the defect.

B-1. Operation for Estimating Defect Source

For estimation of the defect source, the data processing unit 15 separates the image of the defect and that of its periphery (in other words, the image of an area formed exactly according to the design) to calculate an index value as processed data T20 (second processed data) indicating a shape of the defect from the defect image (Step ST8).

As the index indicating the shape of the defect adopted are horizontal/vertical diameter, area equivalent diameter, surface equivalent diameter, major axis, minor axis, area valance point, surface valance point, specific shape factor, bulk factor, smooth factor, height, concavity/convexity, Franctal diameter and the like.

The surface equivalent diameter refers to a diameter of a circle having the same surface area as the defect image.

The area valance point refers to center coordinates of the circle having the same area as the defect image.

The surface valance point refers to center coordinates of the circle having the same surface area as the defect image.

The specific shape factor refers to a ratio of the longest value and the shortest value among distances of two parallel lines that sandwich the defect image in a plurality of directions.

The bulk factor refers to a ratio of the volume and the surface area of the defect image.

The smooth factor is defined as standard deviation of brightness of pixels constituting the defect image.

The concavity/convexity refers to a value obtained by integrating reverse numbers in sign of continuous variations (derivative) of mean values of brightness of pixels in a predetermined area.

The brightness refers to a value representing degree of brightness of the image, and in a case of a digital image, it refers to a value obtained by classifying pixels from the brightest point (pixel) to the darkest point (pixel) into a predetermined numbers of levels, generally by 256 levels. Contrast is used as like parameter. The contrast refers to a value representing a width between brightness and darkness of the image, and in a case of a digital image, a predetermined value represents a width between the brightest point (pixel) and the darkest point (pixel).

The Fractal dimension refers to a value representing complexity of the defect surface, obtained from the number of sides of a figure having self-similarity (different size) for representing concavity and convexity of the surface and the reduction rate.

The processed-data judgment unit 16 estimates the cause of the defect based on the above-mentioned indexes (Step ST9), and gives a warning to a manufacturing apparatus or a manufacturing process that is estimated to be the defect source if necessary (Step ST10). At this time, since some action, e.g., stopping the manufacturing apparatus or the manufacturing process which receives the warning, should be made, the warning is given after consideration on whether the following steps would be affected or not if the defect under investigation is left.

B-2. Operation for Estimating Fatality Rate and Failure Rate

First, concepts of the fatality rate and failure rate of the defect will be discussed. The image data D20 include the images of the defect and its periphery as discussed earlier, and the image of the periphery of the defect is important for estimation of the fatality rate and the failure rate. In other words, functions are not damaged in some kinds of semiconductor integrated circuits, even if some defects exist.

For example, a memory device comprises a memory cell unit, a sense amplifier unit, a subsidiary word line selection unit, a subsidiary bit line selection unit, a column decoder unit, a row decoder unit and the like. Since the memory cell unit, the sense amplifier unit, the subsidiary word line selection unit and the subsidiary bit line selection unit usually have some redundant elements and circuits (referred to as redundancy circuits), a circuit whose function is lost by a defect is replaced by the redundancy circuit to maintain the function as the memory device. Therefore, whether the defect is fatal or not depends on whether the element or circuit whose function is lost by the defect can be replaced by the redundancy circuit or not, and the fatality rate is in a range of 0 to 1 (0 to 100%). In a circuit having no redundancy circuit, the fatality rate of defect is basically 100%. The fatality rate of all the chips is determined in consideration of respective fatality rates of defects, and the quality of the chip is decided therefrom. Then, totaling the number of failure chips in a wafer and dividing the total number by the number of chips in a wafer gives the failure rate. Further, the failure rate may be obtained from the number of chips in one lot of wafer.

The data processing unit 15 recognizes where the defect under investigation is located in a chip from the image of the periphery of the defect in the image data D20 and calculates the fatality rate and the failure rate in consideration of whether a redundancy circuit is provided or not and whether the element or circuit having the defect may be replaced or not (Step ST11).

The calculated fatality rate and failure rate are fed as fatality-rate/failure-rate data FD back to a system for managing a production planning of the semiconductor device (Step ST12), and the data FD are used for controlling the volume of production according to the failure rate. For example, if the failure rate is 10%, the number of wafers to be charged is increased in order to raise the volume of production by 10%, thus achieving the target volume of production.

C. Specific Operation of Quality Management System

C-1. Specific Operation for Estimating Defect Source

As an example of specific operation of the quality management system of the present invention, first, an operation of estimating the defect source will be discussed along the flowcharts of FIGS. 3 and 4 with reference to FIG. 1. In this discussion, it is assumed that an extraneous matter, not a break of pattern, is found as the defect in the in-line inspection for a block under a metal wiring step.

The inspection device 10 outputs the X-direction diameter, the Y-direction diameter, the area equivalent diameter, the positional coordinates of the defects as the measured data D10 (Step ST1). It is assumed herein that the X-direction diameter, the Y-direction diameter and the area equivalent diameter are equal, not more than 1 $\mu$m, and the defects are dispersed from the positional coordinates.

The data processing unit 11 processes the measured data D10 and calculates the number of defects (the index value ID2) whose size is not more than 1 $\mu$m, to know that the number of these defects forms a very high proportion of the number of all the defects. Further, the unit 11 calculates the number of defects (the index value ID3) in a cluster condition by processing the measured data D10, to know that few defects are in a cluster condition (Step ST2).

The processed-data judgment unit 12 compares the above information with a predetermined judgment condition (Step ST3). The judgment condition defines, for example, that an investigation of the observation device 20 is needed when the number of defects whose X-direction diameter, Y-direction diameter and area equivalent diameter are almost equal and whose horizontal/vertical diameter is not more than 1 $\mu$m accounts for not less than 70% of the number of all the defects.

From the information obtained in the above steps that the X-direction diameter, the Y-direction diameter and the area equivalent diameter are almost equal and the horizontal/vertical diameter is not more than 1 $\mu$m, the defect is estimated to be a spherical extraneous matter. In further consideration that these defects are found in the wiring step and few defects are in a cluster condition, it is judged that the defect may be caused, with good possibility, by some trouble in an exhaust system of a plasma etching apparatus and a warning may be given to the plasma etching apparatus. Since the above judgment condition is determined, if the judgment condition is satisfied, no warning is given at this point. Specifically, in order to ensure the possibility that the defect is the spherical extraneous matter, execution of further investigation (probe) is selected.

When the execution of investigation in the observation device 20 is decided, the processed-data judgment unit 12 gives an instruction/command CM10 to the observation device 20. At this time, for efficient investigation, an instruction is given to investigate only the defects satisfying a predetermined condition, not all the defects. For this, the sampling unit 13 decides a sampling condition such as the defects whose X-direction diameter, Y-direction diameter and area equivalent diameter are almost equal and whose horizontal/vertical diameter is not more than 1 $\mu$m (Step ST4).

Subsequently, the file making unit 14 makes a file (transfer file. FT) for transferring the positional-coordinate information of the defect satisfying the above sampling condition to the observation device 20, and transfers the file to the observation device 20 (Step ST5). Concurrently, the wafer to be inspected is transferred from the inspection device 10 to the observation device 20.

The observation device 20 makes an observation of the defect based on the positional-coordinate information of the transfer file FT (Step ST6). The device 20 magnifies the images of the defect and its periphery and outputs the image data D20 including the images of the defect and its periphery (Step ST7).

The device 20 separates the images of the defect and its periphery from the image data D20 and calculates an index value indicating a shape of the defect from the image of the defect (Step ST8). In this example, as the index indicating the shape of the defect adopted are the specific shape factor, the concavity/convexity and the smooth factor. It is derived that the defect is a spherical extraneous matter from a specific shape factor of almost 1, a concavity/convexity of almost zero, small derivative of brightness of the pixel and large smooth factor (smooth).

Two-dimensional data such as the specific shape factor can be obtained by covering the defect with a plurality of pixels having a predetermined area, like calculation of the measured data D10 as discussed with reference to FIG. 2. Three-dimensional data such as the concavity/convexity and the smooth factor can be obtained by measuring the brightness and contrast of reflected or scattered electrons and light.

In further consideration that these defects are found in the wiring step and few defects are in a cluster condition, the processed-data judgment unit 16 judges that the defect may be caused by some trouble in an exhaust system of a plasma etching apparatus (Step ST9). Further, with judgment that there is a possibility that a product through the following steps may be affected if the defect is left, a warning is given to the plasma etching apparatus (Step ST10).

Furthermore, in order to specify the plasma etching apparatus as the defect source, a database is made in advance, associating kinds of defects with manufacturing apparatus that would cause the defects from data on a variety of defects caused by troubles of the plasma etching apparatus, and the processed-data judgment unit 16 has to check the characteristic features of these defects, specifically that it is a spherical extraneous matter and found in the wiring step and few are in a cluster condition, with the database.

The database on defects is made based on past data regarding manufacture of a semiconductor device. Making a database not only on the shape and formation of the defect but also on the extraneous matter and the component and source thereof based on past data regarding an extraneous matter as a defect allows a qualitative analysis of the defect, i.e., the spherical extraneous matter to be concurrently executed in this example, and judgment in consideration of the analysis result allows estimation of the source of the spherical extraneous matter with high accuracy.

Furthermore, in order to check the component of the extraneous matter, it is necessary to prepare a component analysis device (defect analysis device) and give an index value regarding the component to the processed-data judgment unit 16. Since the observation device and the component analysis device makes an analysis of defects, these devices can be generally termed a defect analysis device.

The judgment on whether there is a possibility that the defect affects a final product if the defect is left can be made with reference to the database based on the past data.

C-2. Specific Operation for Estimating Fatality Rate and Failure Rate

Figure 5:
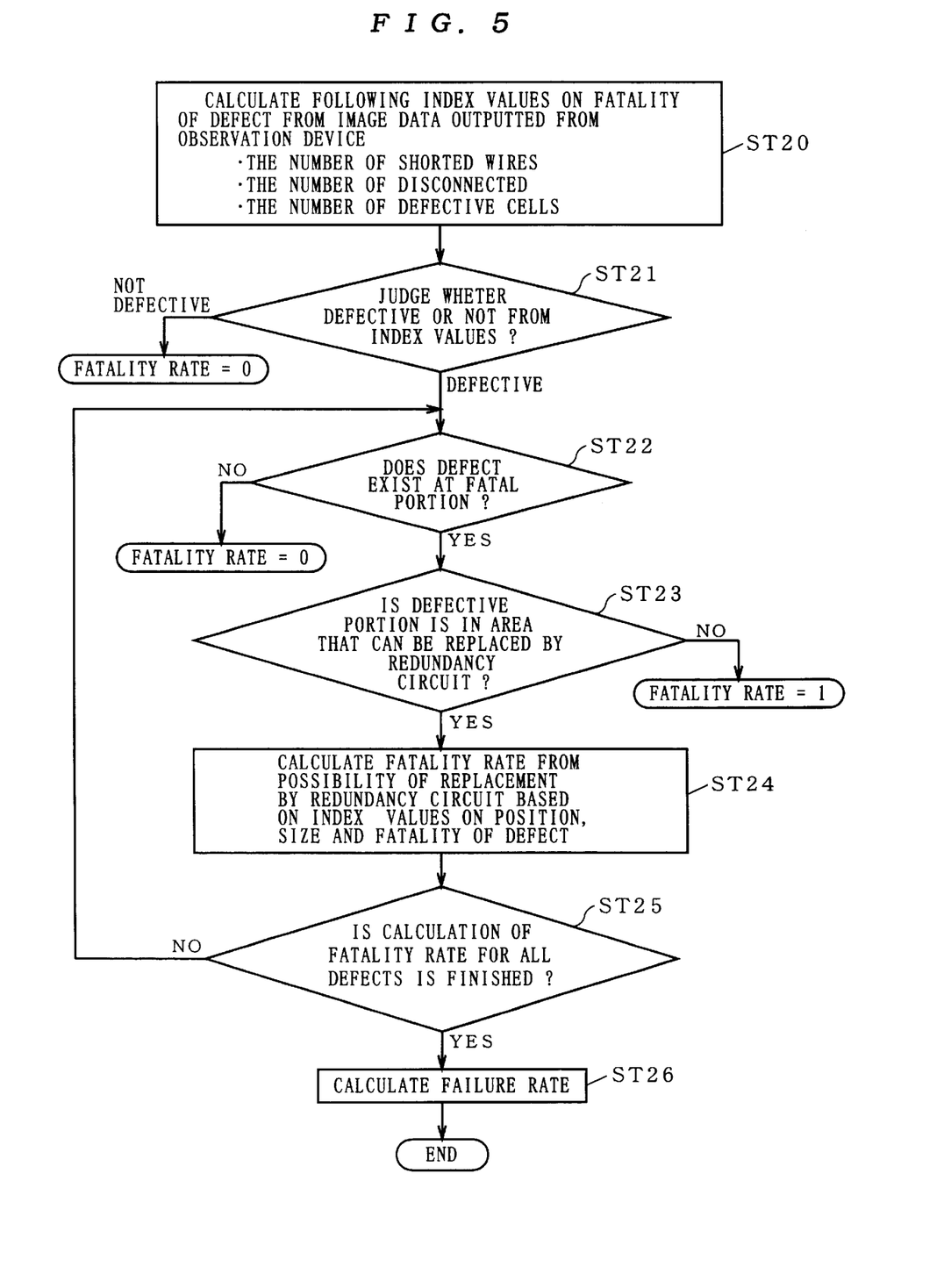
FIG. 5 is a flowchart showing an operation of the quality management system for estimating a fatality rate in accordance with the present invention.

The operation of estimating the fatality rate and failure rate., i.e., the operation in Step ST11 of FIG. 4 will be specifically discussed with reference to FIGS. 5 and 6. In this discussion, it is assumed that a break of pattern is found as the defect in the in-line inspection for a block under a metal wiring step. The inspection device 10 specifies the defect and the observation device 20 probes the defect based on the positional-coordinate information of the defect, like the above-discussed operation.

First, the data processing unit 15 calculates an index value indicating the fatality such as the number of shorted wires, the number of disconnected wires and the number of defective cells based on the image data D20 outputted from the observation device 20 (Step ST20). The defective cell refers to a cell having a defect in its basic structure (control electrode, source/drain electrode and the like) in the memory cell unit of the memory device.

The processed-data judgment unit 16 judges that there is no abnormal condition (fatality rate of zero) when the index values are all zero, and judges that there is an abnormal condition and the investigation should be continued when any of the index values is not zero (Step ST21).

Figure 6:
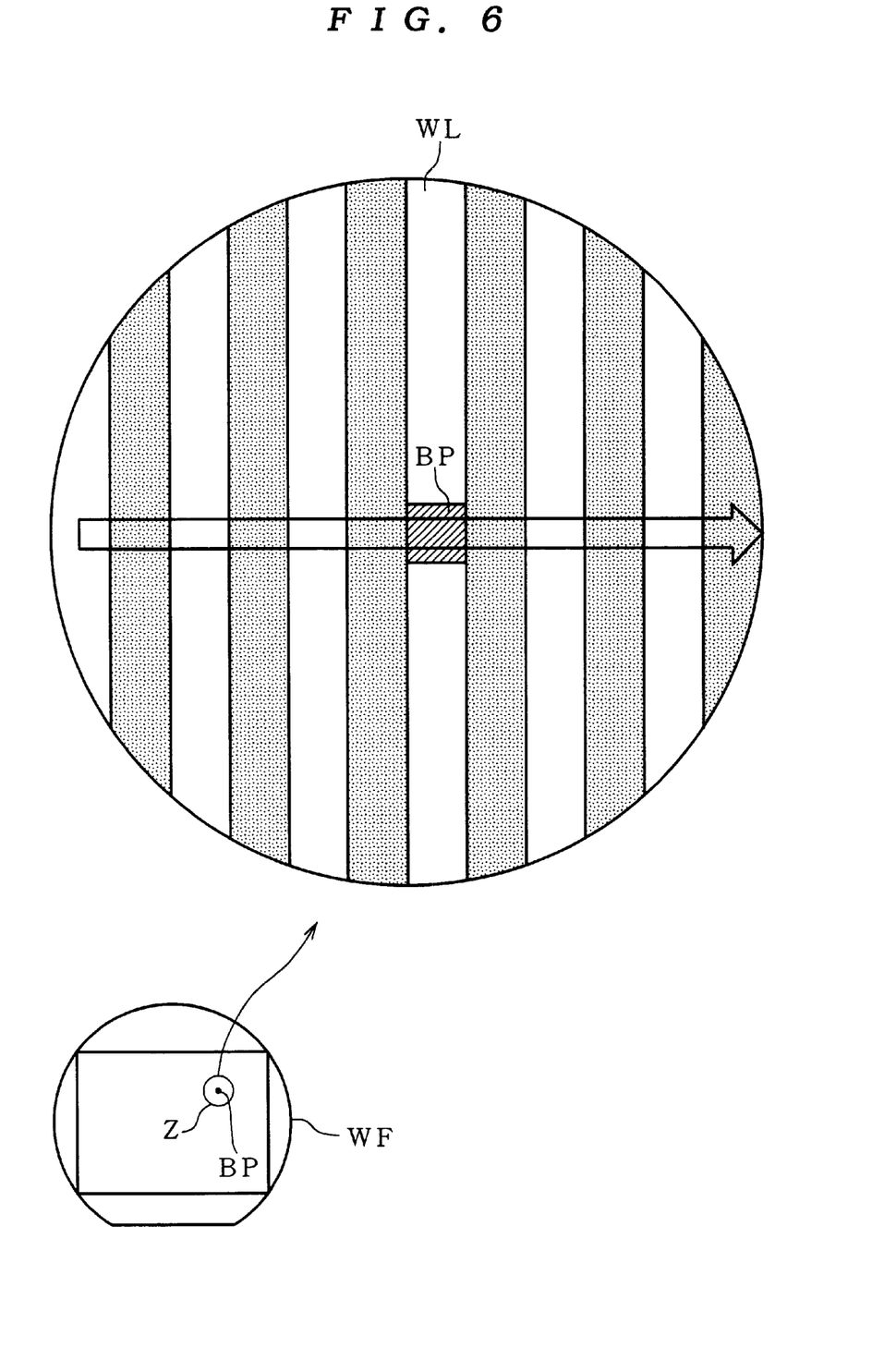
FIG. 6 is an illustration of a method for measuring a defect by an observation device.

With reference to FIG. 6, an exemplary method for specifying a portion of the wire disconnection will be discussed. FIG. 6 shows a disconnection portion BP that exists in the area Z of the wafer WF, and also shows a magnification of the area Z. As shown in FIG. 6, a plurality of wiring patterns WL are disposed in parallel in the area Z and the disconnection portion BP exists in one of the wiring patterns WL.

As a method of knowing the disconnection portion BP used is a measurement of brightness of a reflected light through light irradiation. Specifically, the wiring patterns WL are irradiated while moving a light source so that the light may be applied orthogonally to a direction of pattern alignment as indicated by an arrow in FIG. 6 and a fixed photodetector measures the brightness of the reflected light, or the wiring patterns WL are irradiated by a fixed light source and a moving photodetector measures the brightness of the reflected light. This method provides data on the brightness of the light reflected from the wiring patterns WL with periodic characteristics, and analyzing the frequency of the data shows the interval of the wiring patterns WL and existence of defect.

Specifically, if the wiring patterns WL have no defect (disconnection), the data on brightness shows a periodic predetermined brightness and if any defect (disconnection), the data shows an unperiodic brightness because of low brightness at the defect (disconnection). Checking the degree of unperiodicity reveals the number of defects (disconnections).

Further, a short of the wiring patterns WL can be inspected in the same manner. In this case, checking whether a portion that should originally show unperiodic brightness (the wires should keep the interval) shows periodicity or not reveals the number of defects (shorts).

Next, by checking surroundings of a portion having a defect, judgment is made on whether existence of a defect is fatal in the portion or not (Step ST22). This step is executed to except some of the defects that exist at a portion without circuit pattern or at a portion whose circuit pattern is not affected by any defect, where any defect is not fatal, from taking the investigation. Therefore, when it is judged that the defect exists at a portion where any defect has no fatal effect, the fatality rate is estimated to be zero, and when it is judged that the defect exists at a portion where any defect has a fatal effect, a further investigation on the defect should be made.

The surroundings of the defect can be grasped by an analysis of whether variation in brightness is periodic or not, period, direction of periodic pattern and the like to know whether there is a circuit pattern or not, interval of circuit pattern and alignment direction of circuit pattern.

Further, through this step, it is possible to know a condition of the circuit around the defect. Specifically discussing taking a memory device as an example, it is possible to know where the defect under investigation exists, at the memory cell unit, the sense amplifier unit, the subsidiary word line selection unit, the subsidiary bit line selection unit, the column decoder unit, the row decoder unit or the like.

This information is used in Step ST23 to judge whether a defective portion exists in a region that can be replaced by a redundancy circuit or not. Specifically discussing taking the memory device as an example, since the memory cell unit and the sense amplifier unit have some redundancy circuits, replacing a circuit whose function is lost by the defect by the redundancy circuit maintains the function of the memory device, and in this case, the existence of the defect is not fatal. That requires a further investigation. By contrast, when it is judged that a defect exists in a region which does not allow replacement by the redundancy circuit in Step ST23, the existence of the defect is fatal and the fatality rate is one.

When it is judged that a defect exists in a region which allows replacement by the redundancy circuit, an investigation is made, based on the indexes on position, size and fatality of the defect, on whether a circuit having the defect can be replaced by the redundancy circuit to obtain the fatality rate (Step ST24).

Since the fatality rate varies when a plurality of defects exist even if the fatality rate of one defect is zero from the judgment that replacement by the redundancy circuit is possible, the fatality rate is calculated after investigation of all the defects in a chip. Specifically, though one chip has several hundred redundancy circuits, replacement (remedy) by the redundancy circuit is impossible when the demand for replacement by redundancy circuit exceeds the number of chips or any defect exists in a circuit that can not be replaced by the redundancy circuit. The rate of impossibility in replacement (remedy) is regarded as the fatality rate.

For example, when the number of remediable defects is 100 and the number of redundancy circuits is 500, the fatality rate is 0.2 at the worst. In some cases, one defect can not be remedied by one redundancy circuit, depending on position or size, and the fatality rate increases.

This calculation of fatality rate is executed for each defect (at least for each defect to be probed) (Step ST25) and the final fatality rate is calculated through investigation for at least all the defects to be probed. Further, the calculation of the fatality rate is executed for all the chips in a wafer to judge the quality of chips. The criterion of judgment on the quality of chips is whether the fatality rate is 1 or not, and specifically, a chip is judged defective when the fatality rate is 1. The fatality rate of not 1 indicates that the circuit having the defect can be replaced by the redundancy circuit as discussed earlier and judged not defective.

Thus, totaling the number of failure chips in a wafer and dividing it by the number of all the chips in a wafer gives the failure rate (Step ST26).

With the fatality rate and the failure rate, the production planning of the semiconductor device is controlled as mentioned earlier, and in some cases, decision is made on whether a wafer through some steps is disposed of or not.

In other words, primarily, a plurality of wafers out of one lot (50 to 100 wafers) are sampled and take an inspection in the in-line inspection. In such a case, when one wafer under inspection has high failure rate (for example, all the chips are defective) and other wafers have few failure chips, only the wafer having high failure rate is disposed of, and when all the wafers have high failure rate, all the wafers of the lot are disposed of. With such a disposal, it is possible to prevent lots of wafers from taking the following steps and avoid loss in expense.

D. Characteristic Action and Effect

As discussed above, the quality management system of the present invention automatically makes estimation of the defect source and decision on whether to give an warning to the manufacturing apparatus and associated manufacturing step that may be the defect source based on the information regarding the defects provided by the inspection device, makes decision on whether a further investigation should be made and automatically makes estimation of the defect source and decision on whether to give an warning to the manufacturing apparatus and associated manufacturing step that may be the defect source based on the information regarding the defects provided by the observation device. Further, the quality management system automatically makes calculation of fatality rate of the defect, and therefore it is possible to reduce time and labor taken from founding of the defect to recognition of occurrence of abnormal condition and improve calculation accuracy of the fatality rate of defect.

E. Application to Recording Medium

Furthermore, the functions of the quality management system of the present invention may be realized on a computer as a quality management program. Specifically, the respective functions of the data processing unit 11 (first data processing means), the processed-data judgment unit 12 (first processed-data judgment means), the sampling unit 13 (sampling means), the file making unit 14 (file making means), the data processing unit 15 (second data processing means) and the processed-data judgment unit 16 (second processed-data judgment means) constituting the quality management system of FIG. 1 are realized on the computer, and the procedure is realized by the quality management program according to the flow shown in FIGS. 3, 4 and 5. In this case, the quality management program recorded in a recording medium such as a floppy disk and a CD-ROM is provided.

F. Integration into Inspection Device and Observation Device

Though the quality management system S100 is provided separately from the inspection device and the observation device in the foregoing discussion, the system S100 naturally can be integrated into the inspection device and the observation device. In this case, the whole system S100 may be integrated into one of the inspection device and the observation device or the system S100 may be functionally separated into two parts to be integrated into the inspection device and the observation device, respectively.

Specifically, the data processing unit 11, the processed-data judgment unit 12, the sampling unit 13 and the file making unit 14 are integrated into the inspection device, and the data processing unit 15 and the processed-data judgment unit 16 are integrated into the observation device.

While the invention has been shown and described in detail, the foregoing description is in all aspects illustrative and not restrictive. It is therefore understood that numerous modifications and variations can be devised without departing from the scope of the invention.

We claim:

1. A quality management system for managing quality variance of a semiconductor device in a process of manufacturing said semiconductor device based on a design, by investigating defects of a semiconductor device under manufacture out of conformance with a design, comprising:

first data processing means receiving first measured data on said defects outputted from a defect inspection device, for processing said first measured data to calculate first processed data including index values on the number and distribution of said defects;

first processed-data judgment means receiving said first processed data, for making a judgment, based on a predetermined judgment condition, on whether a further investigation on said defects should be made or not;

sampling means for sampling an object defect to be probed among said defects based on a predetermined sampling condition when it is judged that said further investigation should be made and outputting data on positional coordinates of said object defect to a defect analysis device;

second data processing means receiving second measured data outputted from said defect analysis device as a result of analyzing said object defect based on said data on said positional coordinates, for processing said second measured data to calculate second processed data including index values at least on a shape of said object defect; and second processed-data judgment means receiving said second processed data, for automatically making an estimation, based on said second processed data, on what apparatus and process for manufacturing said semiconductor device may be a defect source.

2. The quality management system of claim 1, wherein said first measured data include at least one of the total number of defects in a unit of inspected area, area of each of said defects and area equivalent diameter, positional coordinates and indexes indicating size of each of said defects, said indexes indicating size being horizontal/vertical diameter, major axis and minor axis, said semiconductor device is one of a plurality of chips formed on a semiconductor wafer, said index values on the number and distribution of said defects include at least one of a first index value indicating the number of defects and the number of chips having said defects among said plurality of chips, a second index value indicating the number of defects within a predetermined size range and the number of chips having said defects among said plurality of chips within said predetermined size range, and a third index value indicating the number of defects in a predetermined cluster condition and the number of chips having said defects among said plurality of chips in said predetermined cluster condition, and said first processed-data judgment means further has a function of automatically making an estimation, based on said first processed data and at least one of said first to third index values, on what apparatus and process for manufacturing said semiconductor device may be said defect source.

3. The quality management system of claim 2, wherein said sampling condition includes at least one of a first condition defining that a specified number of said defects should be sampled in ascending or descending order of size, a second condition defining that some of said defects within said predetermined size range should be sampled, a third condition defining that some of said defects existing within a predetermined area or outside said predetermined area should be sampled, a fourth condition defining that said defects existing in said predetermined area should be sampled when said defects are in said predetermined cluster condition, and a fifth condition defining that said defects satisfying a combination of two or more out of said first to fourth conditions.

4. The quality management system of claim 1, wherein said defect analysis device is an observation device for observing said shape of said object defect, said second measured data are image data representing magnification of said object defect and its periphery, said index values on said shape of said object defect include at least one of indexes indicating two-dimensional shape of said object defect, namely, horizontal/vertical diameter, area equivalent diameter, surface area equivalent diameter, major axis, minor axis, area valance point, surface valance point and specific shape factor and indicating said three-dimensional shape of said object defect derived from said image data, namely, bulk factor, smooth factor, height, concavity/convexity and Fractal dimension, and said estimation on said defect source is made by checking said index values on said shape of said object defect with a database associating defective conditions of said apparatus and said process for manufacturing said semiconductor device with defects caused thereby.

5. The quality management system of claim 4, wherein said second data processing means further has a function of deriving at least one of index values on fatality of said defects, namely, the number of shorted wires, the number of disconnected wires and the number of defective cells, and said second processed-data judgment means further has a function of calculating a fatality rate of said defects to said semiconductor device based on said index values derived by said second data processing means.

6. The quality management system of claim 5, wherein said second processed-data judgment means judges whether there is any index value on said fatality of said defects, judges whether said object defect exists at a portion where any defect can be fatal to said semiconductor device when said index value is not zero, judges whether said portion is in an area which can be replaced by a redundant circuit in said semiconductor device or not when it is judged that said object defect exists at said portion where any defect can be fatal, and calculates said fatality rate from a possibility of replacing a circuit having any defect by said redundant circuit based on said index values on said positional coordinates, said size of said object defect and said fatality of said defects when it is judged that said portion is in said area which can be replaced by said redundant circuit.

7. The quality management system of claim 6, wherein said semiconductor device is one of a plurality of chips formed on a semiconductor wafer, and said second processed-data judgment means further has a function of totaling said fatality rates of said plurality of chips in said semiconductor wafer to judge quality of said plurality of chips and dividing the total number of failure chips in said semiconductor wafer by the total number of chips to obtain a failure rate.

8. A recording medium for recording a program to perform a quality management of a semiconductor device with a computer by investigating defects of a semiconductor device under manufacture out of conformance with a design in a process of manufacturing said semiconductor device based on said design, said program being used on said computer for performing:

a first data processing function for receiving first measured data on said defects outputted from a defect inspection device and processing said first measured data to calculate first processed data including index values on the number and distribution of said defects;

a first processed-data judgment function for receiving said first processed data and making a judgment, based on a predetermined judgment condition, on whether a further investigation on said defects should be made or not;

a sampling function for sampling an object defect to be probed among said defects based on a predetermined sampling condition when it is judged that said further investigation should be made and outputting data on positional coordinates of said object defect to a defect analysis device;

a second data processing function for receiving second measured data outputted from said defect analysis device as a result of analyzing said object defect based on said data on positional coordinates of said object defect and processing said second measured data to calculate second processed data including index values at least on shapes of said object defect; and a second processed-data judgment function for receiving said second processed data and automatically making an estimation, based on said second processed data, on what apparatus and process for manufacturing said semiconductor device may be a defect source.

* * * * *